US011777043B1

(12) United States Patent
Hazbun et al.

(10) Patent No.: US 11,777,043 B1
(45) Date of Patent: Oct. 3, 2023

(54) PHOTODETECTORS WITH SUBSTRATE EXTENSIONS ADJACENT PHOTODIODES

(71) Applicant: GlobalFoundries U.S. Inc., Malta, NY (US)

(72) Inventors: Ramsey M. Hazbun, Colchester, VT (US); John J. Ellis-Monaghan, Grand Isle, VT (US); Rajendran Krishnasamy, Essex Junction, VT (US); Siva P. Adusumilli, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/807,887

(22) Filed: Jun. 21, 2022

(51) Int. Cl.
 *H01L 31/0352* (2006.01)
(52) U.S. Cl.
 CPC .......................... *H01L 31/035281* (2013.01)
(58) Field of Classification Search
 CPC .......... H01L 31/035272–03529; H01L 31/112; H01L 31/035281; H01L 27/1461–14612; H01L 27/14689
 See application file for complete search history.

(56) References Cited

U.S. PATENT DOCUMENTS

| 6,465,846 B1 * | 10/2002 | Osanai ................. H01L 31/101 257/E27.127 |
| 9,348,019 B2 | 5/2016 | Wang et al. |
| 10,256,264 B2 | 4/2019 | Na et al. |
| 10,861,888 B2 | 12/2020 | Na et al. |
| 2009/0101909 A1 * | 4/2009 | Chen .................. H01L 31/1808 257/65 |
| 2011/0037133 A1 | 2/2011 | Su et al. |
| 2016/0141329 A1 | 5/2016 | Cheng et al. |

FOREIGN PATENT DOCUMENTS

| EP | 3610510 B1 | 7/2021 |
| GB | 2247985 A | 3/1992 |

OTHER PUBLICATIONS

EP Search Report for corresponding EP Application No. 22205695.4 dated May 17, 2023, 10 pages.

* cited by examiner

*Primary Examiner* — Suberr L Chi
(74) *Attorney, Agent, or Firm* — Anthony Canale; Hoffman Warnick LLC

(57) ABSTRACT

A substrate is formed to include a substrate base and a substrate extension. A photodiode contacts the substrate base. The substrate extension is adjacent the photodiode. An additional device contacts the substrate extension. A sidewall spacer contacts the photodiode and the substrate extension. The additional device includes conductive elements within the substrate extension adjacent the sidewall spacer.

17 Claims, 10 Drawing Sheets

PHOTODETECTORS WITH SUBSTRATE EXTENSIONS ADJACENT PHOTODIODES

BACKGROUND

Field of the Invention

The present disclosure relates to photodetectors and more specifically to photodetectors with substrate extensions and adjacent photodiodes.

Description of Related Art

Light (photons) can alter the electrical characteristics of photodiodes, and this allows photodiodes to convert optical signals into electrical signals. This is very useful for image sensors used in, for example, data communications devices. One issue that arises is that photodiodes that use silicon alone are generally limited to use within specific light wavelengths (e.g., between 190 nm and 1100 nm).

To expand photodiodes to additional wavelengths, impurities (dopants) can be added to silicon or different materials can be used as alternatives to silicon. For example, germanium (Ge), indium gallium arsenide (InGaAs), lead(II) sulfide PbS, mercury cadmium telluride (Hg1-xCdxTe), etc., can be used in place of, or with, silicon to expand the light wavelengths in which photodiodes operate with high light to electrical signal conversion efficiencies.

SUMMARY

In structures herein a substrate includes a substrate base and a substrate extension. In such structures, a photodiode contacts the substrate base. The substrate extension is adjacent the photodiode. An additional device contacts the substrate extension. A sidewall spacer is between the photodiode and the substrate extension. The additional device includes conductive elements within the substrate extension adjacent the sidewall spacer.

Some methods herein form a photodetector material on a substrate base and pattern an opening through the photodetector material to expose the substrate base and to define a photodiode. Such methods form an insulator layer on sidewalls of the photodiode in the opening, grow a substrate extension from an exposed portion of the substrate base in the opening in processing that fills the opening with the substrate extension, and form an additional device on the substrate extension.

Additional methods herein form a photodiode on a substrate base, form a sidewall spacer adjacent the photodiode, epitaxially form a substrate extension adjacent the photodiode, and form an additional device on the substrate extension.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, impurities (dopants) or non-silicon structures can be added to silicon-based photodiodes to broaden the light wavelengths at which the photodiodes will efficiently perform light to electrical signal conversion. An issue that arises is that, during manufacture, it can be difficult to form a defect-free non-silicon photo-absorption structure of a photodiode in a trench in a silicon substrate because the silicon substrate often readily combines with the non-silicon material, the trenches may not be formed properly, or the trenches may not fully fill with the non-silicon photo-absorption material, etc.

Additionally, forming a non-silicon material within trenches in a silicon substrate can result in the substrate and the non-silicon material within the trenches having a coplanar top surface. This results in the adjacent readout circuitry only being co-planar with the photo-absorption structure, which can limit design flexibility.

In view of these and other issues, structures herein are formed in processing that forms a full layer of the photo-absorption material on a substrate base, after which the photo-absorption material is patterned into the photodiode. Once such a patterned photodiode is in place on the substrate base, sidewall spacers are formed on the photodiode, and substrate extensions are grown from/on the substrate base between the non-silicon photodiode.

With these processes, defect-free photodiodes are consistently formed. Specifically, the sidewall spacers keep the silicon extensions from combining with the non-silicon photodiode. Further, because trenches are not formed in the substrate, the processing herein avoids any issues with trench imperfections and/or trenches not completely or improperly being filled with the non-silicon photo-absorption material.

Additionally, with processing herein the tops of the substrate extensions are not limited to being co-planar with the tops of the non-silicon photodiode. This permits the tops of the substrates extensions to be above or below the tops of the non-silicon photodiode, and also permits the tops of the substrates extensions to have planar regions and facets at locations where the substrate extensions meet the sidewall spacers. This gives designers much more flexibility when locating the readout circuitry and other components.

Figure 1:
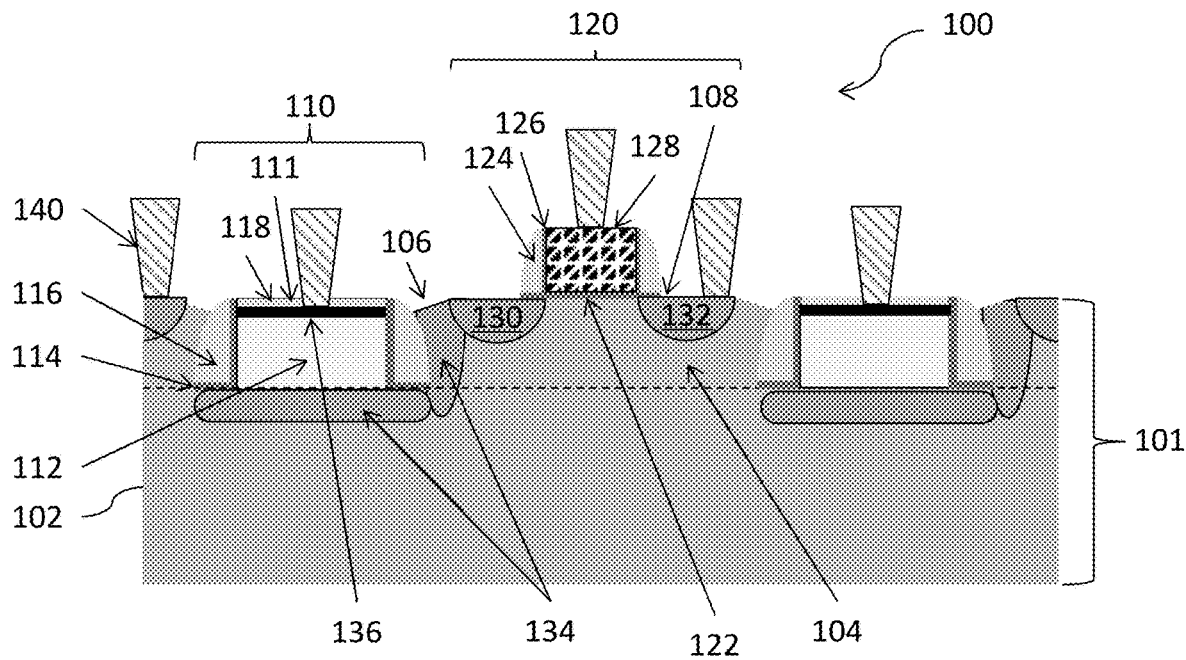
FIGS. 1-5 are cross-sectional conceptual diagrams illustrating photodiode structures according to embodiments herein.

FIG. 1 illustrates one such exemplary structure 100 that includes a substrate 101. As shown in FIG. 1, the substrate 101 is made up of a substrate base 102 and epitaxially grown substrate extensions 104. As shown, the substrate extensions 104 are laterally adjacent and between the photodiodes 112 and such photodiodes 112 contact the substrate base 102. Additionally, sidewall spacers 114, 116 are between the substrate extensions 104 and the photodiodes 112. Note that redundant number identification of repeated structures in the drawings is avoided to enhance drawing clarity and reduce clutter.

Note that, in the structure 100 shown in FIG. 1, the tops of the substrate extensions 104 are co-planar with the tops of the photodiodes 112 and sidewall spacers 114, 116. More specifically, each of the photodiodes 112 has a photodiode top surface 111. The substrate extensions 104 have substrate extension top surfaces 108 that lie in the same plane as the photodiode top surfaces 111. Also, FIG. 1 shows that the substrate extensions 104 have a facet surface 106 between the sidewall spacers 116 and the substrate extension top surfaces 108, and the facet surface 106 is non-parallel to the planar substrate extension top surfaces 108.

The sidewall spacers can include a first insulator layer 114 that contacts the photodiodes 112 and the substrate base 102. In one example, the first insulator layer 114 can have an "L" shape in cross-section. The sidewall spacers additionally include a second insulator layer 116 that contacts the first insulator layer 114 and the substrate extensions 104. In other words, the first insulator layer 114 separates, is between, and physically contacts the photodiode 112 and the second insulator 116.

Additional devices 120 are on/in (and physically contact) the top surfaces 108 of the substrate extensions 104. In the illustrated example, the additional device 120 can be a field effect transistor 120, although any similar devices could be used as the additional devices 120. The additional device 120 shown can include a gate oxide 122 on (physically contacting) the substrate extension top surface 108, a gate conductor or gate conductor stack 128 on (physically contacting) the gate oxide 122, and source and drain regions (conductive elements/regions) 130, 132 within the substrate extensions 104 adjacent the sidewall spacers 116. A gate sidewall insulator 126 and sidewall spacer 124 are included with the additional device 120.

FIG. 1 also illustrates that the structure 100 includes impurity regions 134 within the substrate 101 that electrically connect the photodiodes 112 to the source/drain region 130 of the additional devices 120. Further impurity regions 136 in the photodiode 112 complete the photodiode to form a PIN photodiode made of a P+ region, an Intrinsic layer, and an N+ region. For example, the impurity regions 134, 136 can alternatively comprise the P+ and N+ regions, while the layer 112 can be the intrinsic (undoped) material, such as germanium, etc. While the intrinsic layer 112 and the impurity regions 134, 136 form the complete photodiode, for ease of reference such a PIN structure is often referred to herein simply as the "photodiode 112".

Additionally, a protective cap 118 is on (physically contacts) the photodiodes 112 (the cap 118 and the second insulator layer 116 can be the same material). The photodiodes 112, sidewall spacers 114, 116, and protective cap 118 form what is generically referred to as a photodetector structure 110. Also, conductive contacts 140 are formed to the various elements including the substrate extensions 104, the photodiode structure 112, the gate conductor stack 128, the source/drain region 132, etc.

Figure 2:
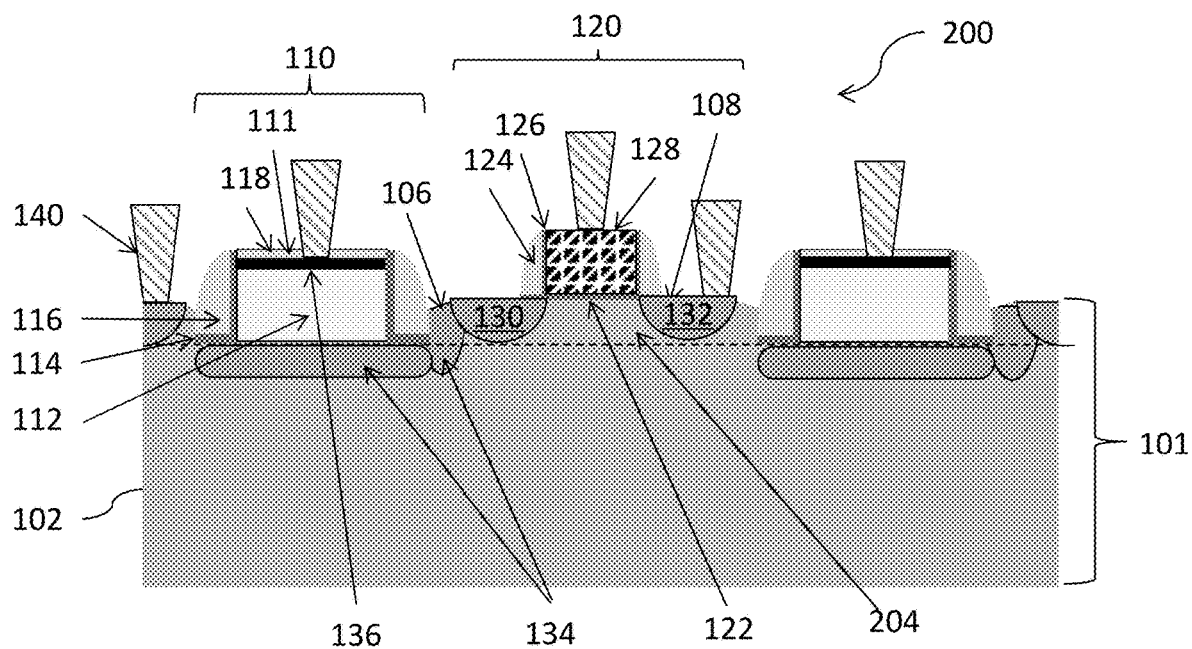

The structure 200 shown in FIG. 2 is similar to the structure shown in FIG. 1 and the same components are identified using the same identification numbers. The structure 200 shown in FIG. 2 differs from the structure 100 shown in FIG. 1 by including substrate extensions 204 that have top surfaces 108 that are not co-planar with the top surfaces 108 of the photodiodes 112. Specifically, the top surfaces 108 of the substrate extensions 204 are relatively closer to the substrate base 102 than are the top surfaces 108 of the photodiodes 112. This effectively raises the photodiodes 112 relative to the additional device 120 which can make processing that forms some of the contacts 140 easier and more accurate.

Figure 3:
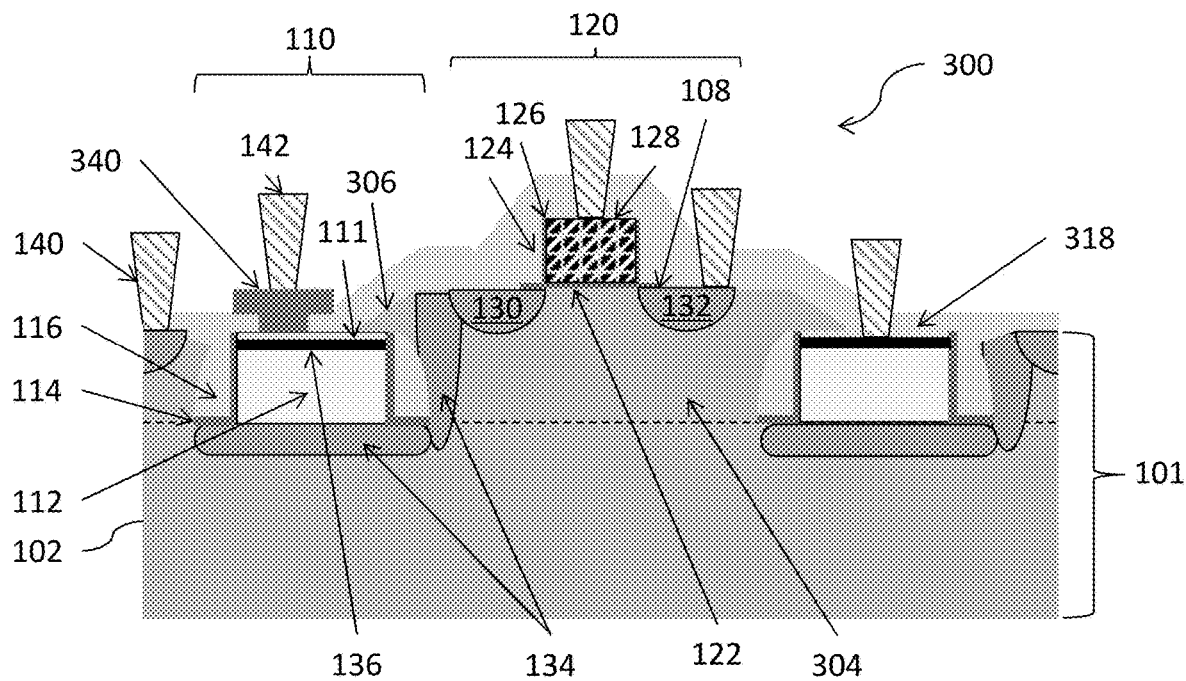

The structure 300 shown in FIG. 3 is similar to the structure shown in FIG. 1 and the same components are identified using the same identification numbers. The structure 300 shown in FIG. 3 differs from the structure 100 shown in FIG. 1 by including substrate extensions 304 that have top surfaces 108 that are not co-planar with the top surfaces 108 of the photodiodes 112. Specifically, the top surfaces 108 of the substrate extensions 304 are relatively further from the substrate base 102 than are the top surfaces 108 of the photodiodes 112. This effectively raises the additional device 120 relative to the photodiodes 112 which can make forming contacts to the additional device 120 easier and more accurate.

Additionally, the structure 300 shown in FIG. 3 includes an insulator layer 318 that is on (physically contacts) the substrate extensions 304, the photodetector structure 110, the additional device 120, etc. The insulator layer 318 can be formed of the same material as the sidewall spacers 124.

Figure 4:
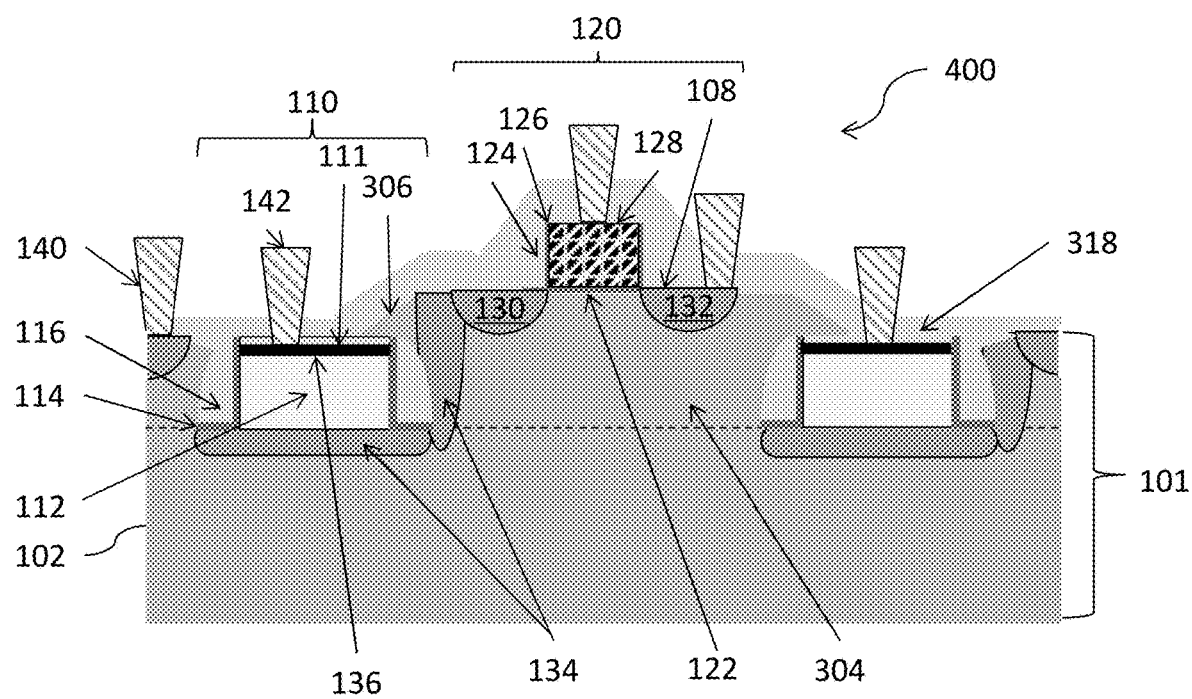

FIG. 3 also shows that the structure includes a contact support 340 extending through the insulator layer 318 upon which the corresponding contact 142 is physically connected. Such a contact support 340 can be formed of a material (e.g., polysilicon, etc.) that more readily bonds with the material of the photodiode 112 and the (usually metal) material of the contacts 140, 142. In contrast, FIG. 4 illustrates a structure 400 that is otherwise the same as the structure 300 shown in FIG. 3 but does not include the contact support 340. Instead, with the structure 400 shown in FIG. 4, the corresponding contact 142 directly contacts the photodiodes 112 through the insulator layer 318.

Figure 5:
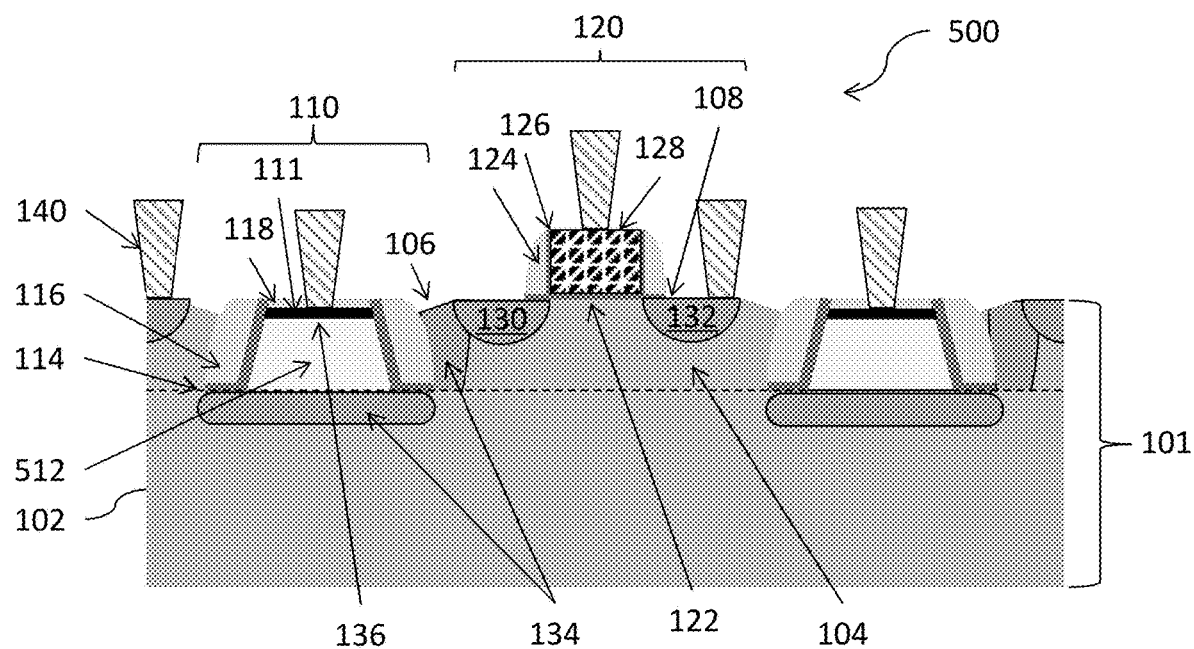

The structure 500 shown in FIG. 5 is similar to the structure shown in FIG. 1 and the same components are identified using the same identification numbers. The structure 500 shown in FIG. 5 differs from the structure 100 shown in FIG. 1 by including photodiodes 512 that have sidewalls that are not perpendicular to the top of the substrate base 102. In contrast, in the structures 100, 200, 300, and 400 that are discussed above, the photodiodes 112 have sidewalls that are substantially perpendicular (e.g., within 5-10% of exactly perpendicular) to the top of the substrate base 102. This gives the photodiode 512 shown in FIG. 5 a trapezoid shape in cross-section. Further, the sidewall spacers 114, 116 are similarly not perpendicular to the top of the substrate base 102.

Figure 6:
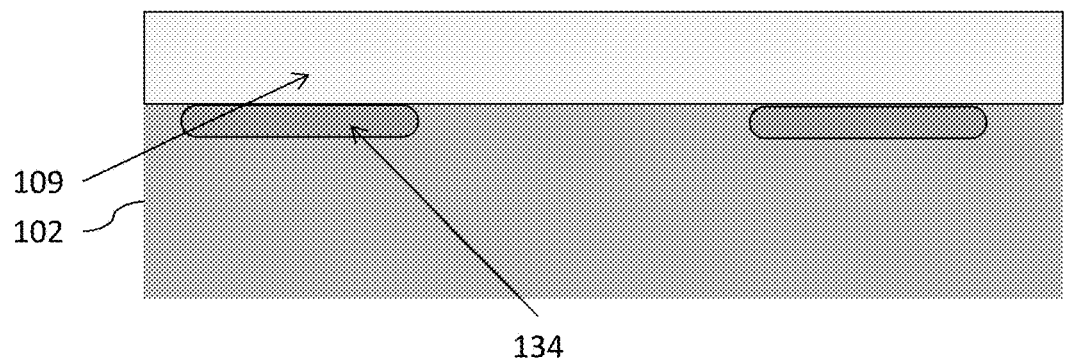
FIGS. 6-14 are cross-sectional conceptual diagrams illustrating processing steps for forming a photodiode structure according to embodiments herein.

FIGS. 6-14 show some process steps that can be used to form the structure 100 shown in FIG. 1. Specifically, FIG. 6 illustrates processing that forms some of the impurity regions 134 and a layer of photo-absorption material 109 on the substrate base 102. Specifically, the substrate base 102 can be any form of useful substrate, such as a bulk silicon substrate or a bulk semiconductor substrate of some other suitable semiconductor material. The impurity regions 134 are formed by implanting a sufficient concentration of dopants into the substrate base 102 before the photo-absorption material 109 is formed to have the impurity regions 134 create a conductive path through the substrate base 102. As noted above, the photo-absorption material 109 can be grown or deposited on the substrate base 102 and can be, in some non-limiting examples, germanium (Ge), indium gallium arsenide (InGaAs), lead(II) sulfide PbS, mercury cadmium telluride (Hg1-xCdxTe), etc. As used herein, "implantation processes" can take any appropriate form (whether now known or developed in the future) and can be, for example, ion implantation, etc.

In the structures and method described herein, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on.

Furthermore, semiconductor regions or layers are referred to as being either P-type semiconductor regions or layers or N-type semiconductor regions or layers. It should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity (i.e., to form a P-type semiconductor region or layer), whereas a silicon-based semiconductor material is typically doped a Group V dopant, such as arsenic (As), phosphorous (P) or antimony (Sb), to achieve N-type conductivity (i.e., to form an N-type semiconductor region or layer). A gallium nitride (GaN)-based semiconductor material is typically doped with magnesium (Mg) to achieve P-type conductivity (i.e., to form a P-type semiconductor region or layer) and with silicon (Si) or oxygen to achieve N-type conductivity (i.e., to form an N-type semiconductor region or layer). Those skilled in the art will also recognize that different conductivity levels will depend upon the relative concentration levels of the dopant (s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Figure 7:
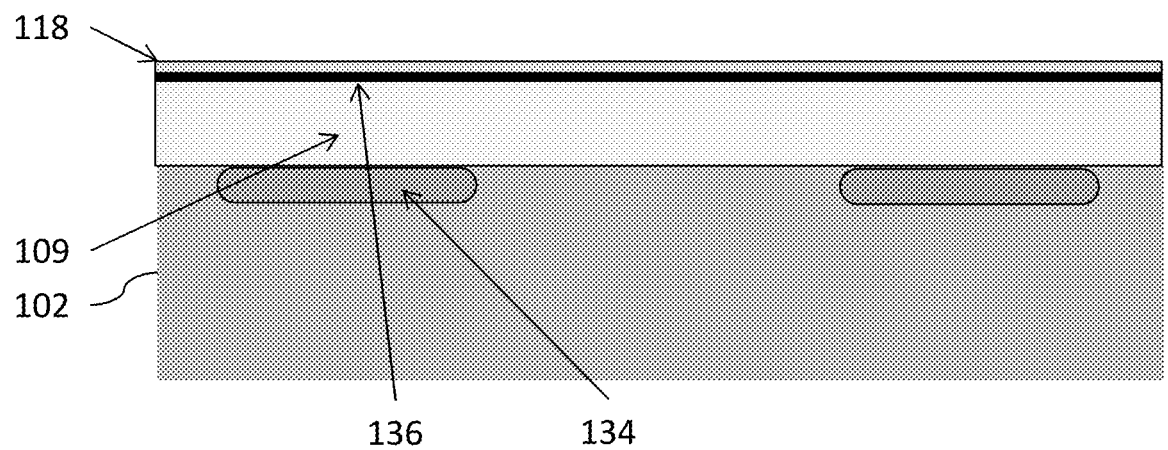
Figure 8:
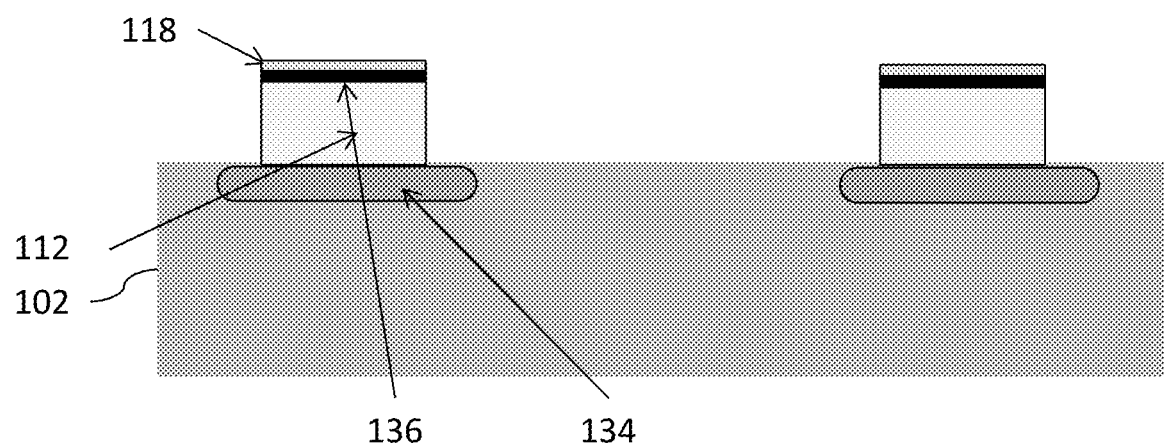

A protective layer 118 (e.g., nitride, etc.) is formed on the photo-absorption material 109, as shown in FIG. 7. A patterning process removes areas of the protective layer 118 and photo-absorption material 109 that are not protected by a mask, as shown in FIG. 8. This leaves the photodiodes 112 on (vertically over or contacting) the impurity regions 134 because both are patterned in similar patterns. Note that the terms vertical and horizontal may be used herein for convenience to refer to directions represented in the drawings; however, such terms are arbitrary and are only used as relative terms to indicate relatively perpendicular directions/ orientations and such terms otherwise have no specific meaning and do not require that the structures itself be maintained in a specific orientation.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

Figure 9:
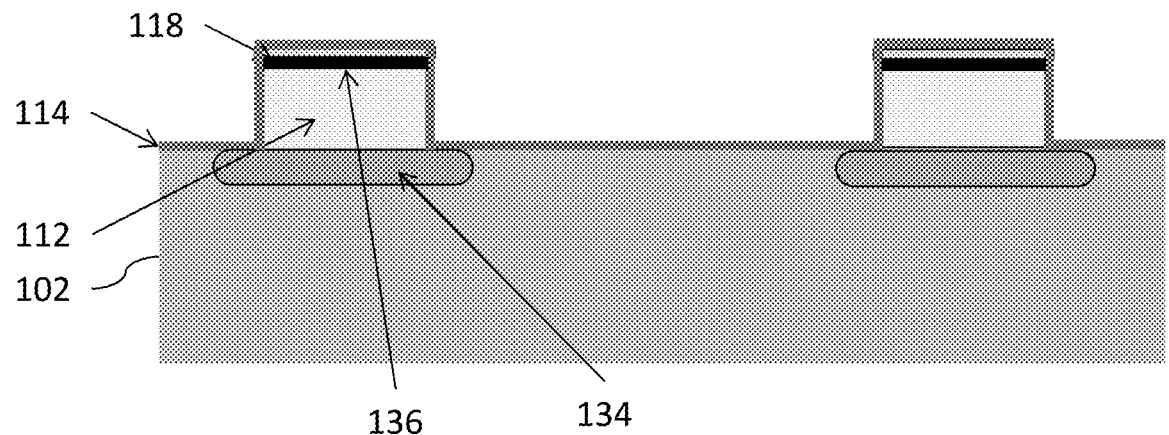
Figure 10:
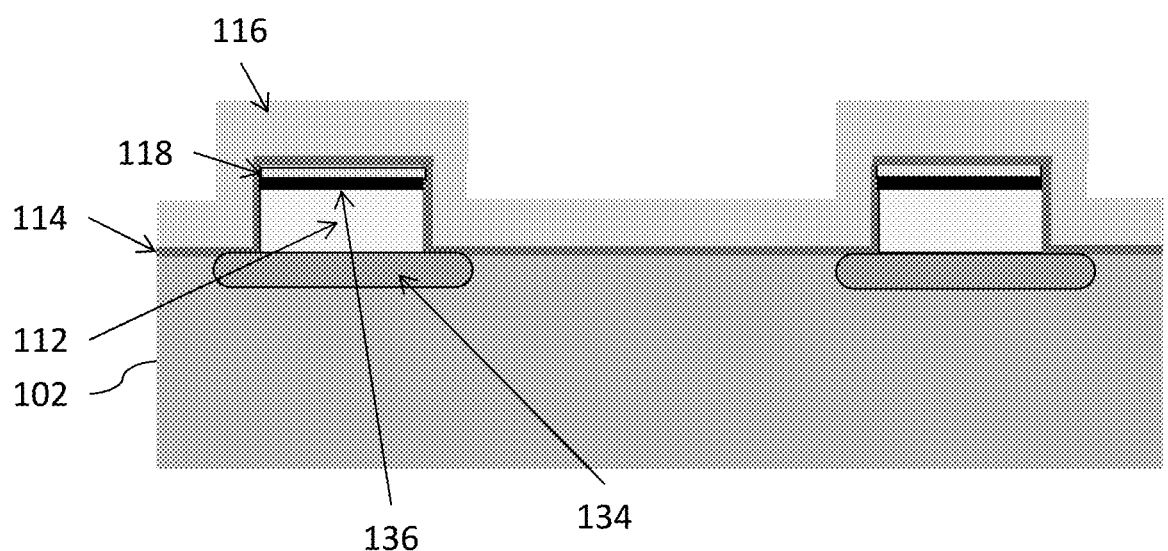

FIG. 9 illustrates the process of forming a first insulator layer 114 over the structure. The first insulator layer 114 can be any form of insulator, such as an oxide, etc. Oxides can be formed by heating a structure within an oxygen rich environment for a specific processing time. In FIG. 10, a second insulator layer 116 is formed over the structure. The first insulator layer 114 can be different from the second insulator layer 116 (which can be a nitride, etc.) because the first insulator layer 114 may be more compatible with the material of the photodiode 112, while the second insulator layer 116 may provide enhanced insulative, durability, and/ or temperature characteristics.

Figure 11:
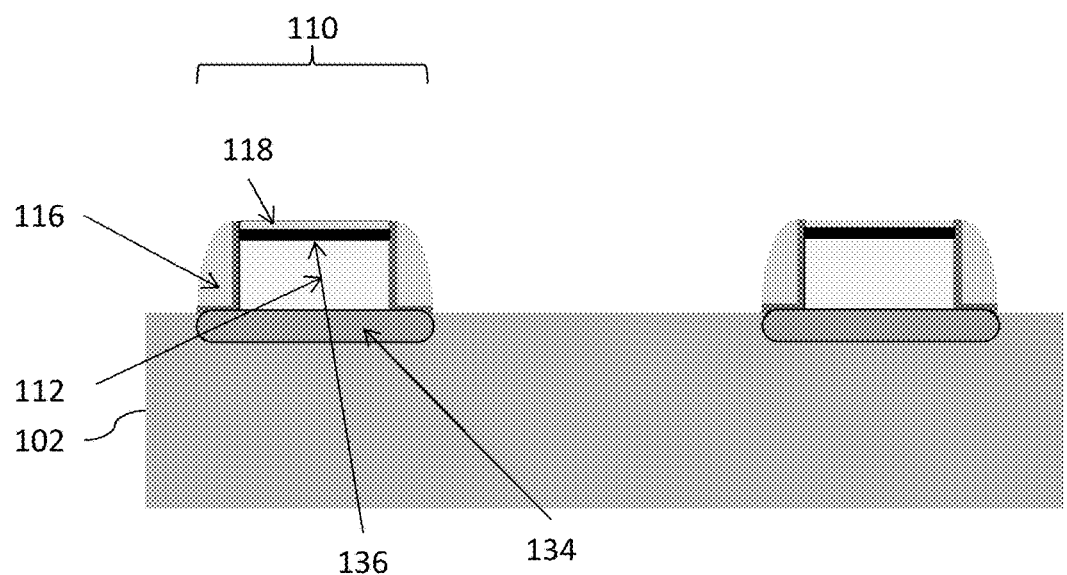

As shown in FIG. 11, portions of the second insulator layer 116 are removed in sidewall spacer processing that can also remove the first insulator 114 from the protective layer 118 and from the top surface of the substrate base 102. This leaves the first insulator layer 114 and second insulator layer 116 as sidewall spacers on the vertical sidewalls of the photodiode 112. For purposes herein, sidewall spacers are generally formed by depositing or growing a conformal insulating layer and then performing a directional etching process (anisotropic) that etches material from horizontal surfaces at a greater rate than its removes material from vertical surfaces, thereby leaving insulating material along the vertical sidewalls of structures. This leaves what is referred to herein as the photodetector structures 110 over the impurity regions 134 in the substrate base 102.

Figure 12:
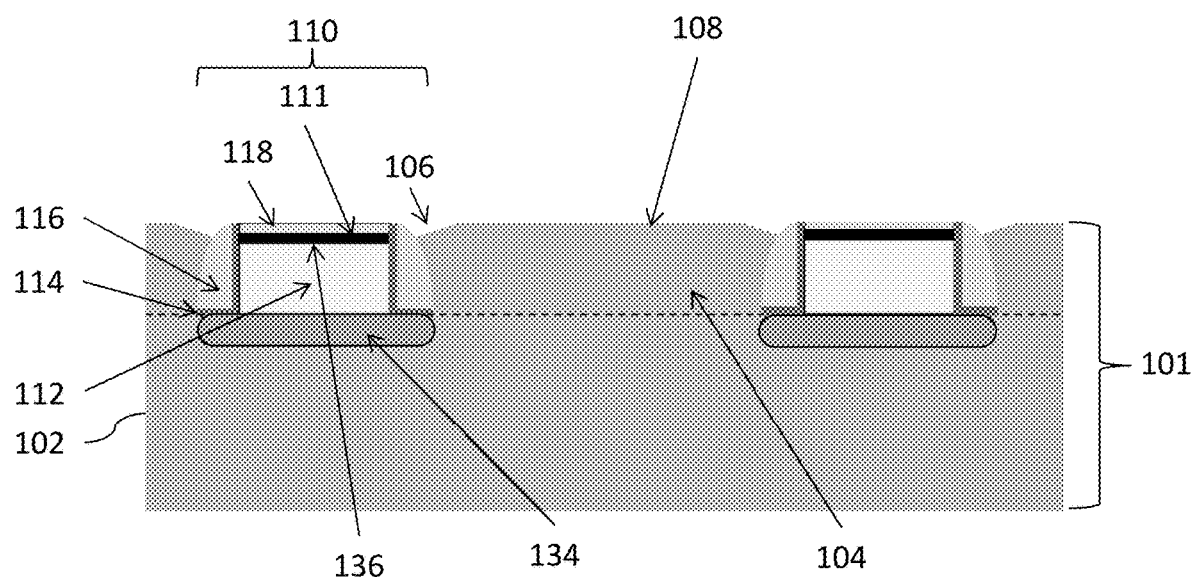

FIG. 12 illustrates that the substrate extensions 104 are formed on the areas of the substrate base 102 that are between the photodetector structures 110. Specifically, the substrate extensions 104 can be formed by epitaxial growth processes. Epitaxial growth occurs in a heated (and sometimes pressurized) environment that is rich with a gas of the material that is to be grown. In such processing, a material that is similar or identical to the substrate base 102 can be epitaxially grown as the substrate extensions 104 (e.g., both can be a form of silicon). The substrate extensions 104 will show distinct crystalline structures that are unique to materials formed through epitaxial growth processes. Further, this epitaxial growth process results in facets 106 (which can be curved surfaces or angled surfaces (that are non-parallel to the top 111 of the photodiode 112 and top 108 of the substrate extension 104)). The facets 106 are portions of the top surface 108 of the substrate extensions 104 in areas wherein the substrate extensions 104 contact the second insulator 116.

Epitaxially growing the substrate extensions 104 provides design flexibility. Thus, while FIG. 12 illustrates that the tops 108 of the substrate extensions 104 can be grown to be at the same vertical distance from the substrate base 102 as the tops 111 of the photodiodes (i.e., tops are in the same plane), as shown in FIGS. 2 and 3 above, controlling (lengthening or shortening) the epitaxial growth process can cause the tops 108 of the substrate extensions 104 to be farther or closer to the substrate base 102 relative to the tops 111 of the photodiodes 112 (i.e., tops are in different planes). Therefore, while FIGS. 6-14 illustrate formation of the structure 100 shown in FIG. 1, one ordinarily skilled in the art would understand how to form the different height substrate extensions 204 and 304 shown in FIGS. 2-4, that are discussed above, without specific illustration here.

Figure 13:
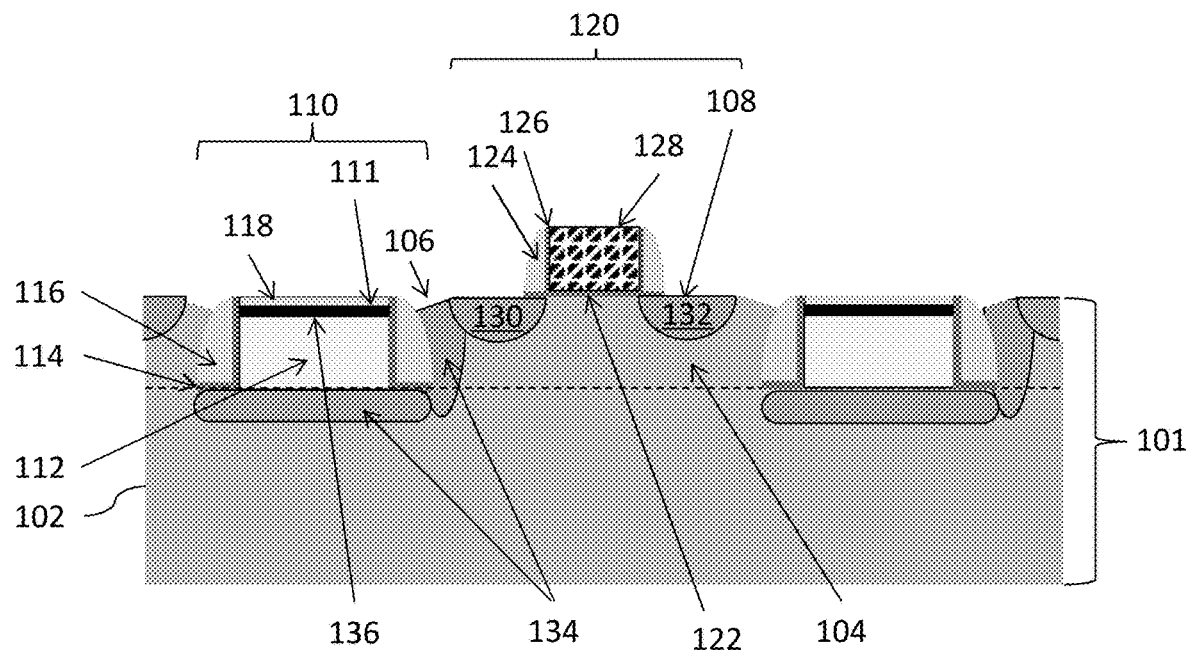

FIG. 13 illustrates that additional devices 120 are formed on the substrate extensions between each of the photodetector structures 110. While, in order to make the drawings clear, only a single additional device 120 illustrated, in the structures herein an additional device 120 can be positioned laterally adjacent each of photodetector structures 110 to allow the light signals detected by the photodetector structures 110 to be processed as digital data.

As noted above, any type of additional device 120 can be formed, depending upon the specific implementation. Here a standard field effect transistor (the varied formation processes of which are known and are evolving) is presented as one example of an additional device 120 and an exhaustive description of formation processes of field effect transistors is not germane to this disclosure. Briefly, the formation processes of such additional devices 120 can include (among other steps): implantation of additional impurity regions 134 in the substrate extensions 104 and substrate base 102 to form a conductive path from the photodetector structure 110 to the additional device 120; formation of the gate oxide 122; formation of a non-functional gate structure; formation of gate sidewall structures 124, 126; implantation of impurities to form the source and drain regions 130, 132; replacement of the non-functional gate structure with a gate conductor 128; formation of overlying cap layers, etc.

Figure 14:
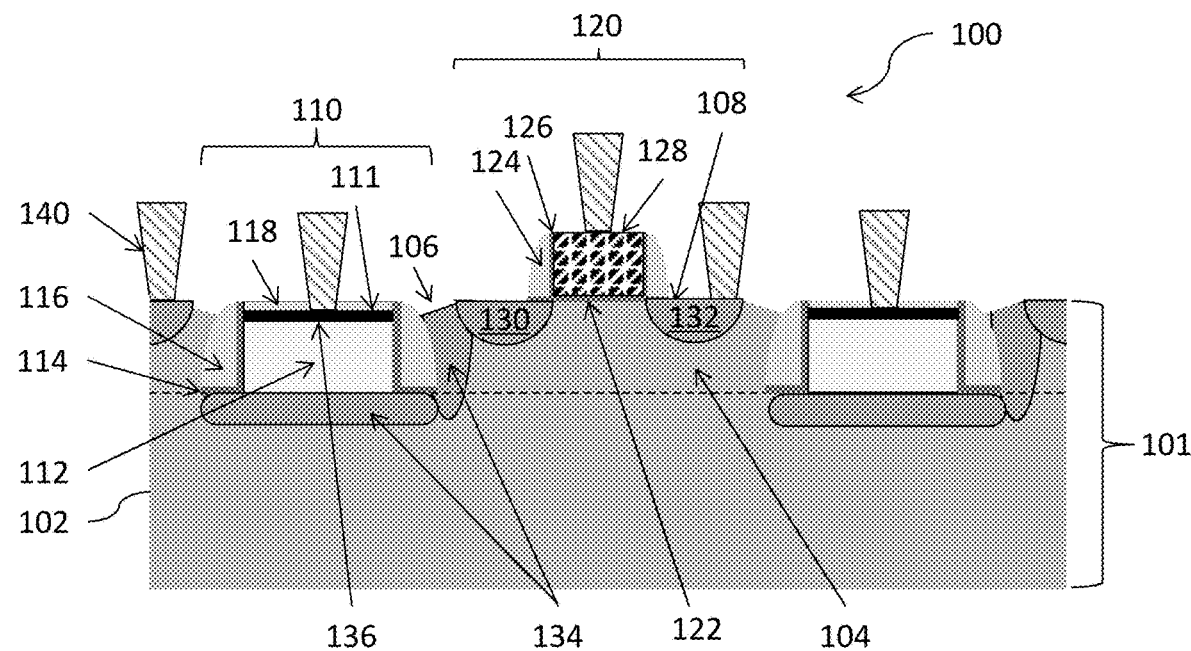

Following this, as shown in FIG. 14, various conductive contacts 140 (e.g., metals, alloys, polysilicon, etc.) are formed to the photodetector structure 110, the gate conductor 128, one of the source or drain structures 132, etc. Note that FIG. 14 is a substantial repeat of FIG. 1 and is represented to aid in reader comprehension.

Figure 15:
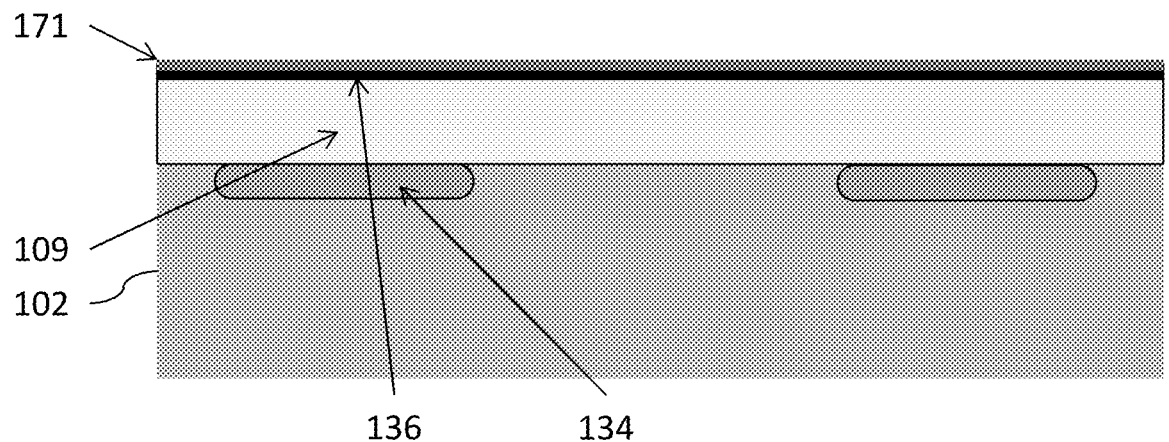
FIGS. 15-19 are cross-sectional conceptual diagrams illustrating processing steps for forming another photodiode structure according to embodiments herein.
Figure 18:
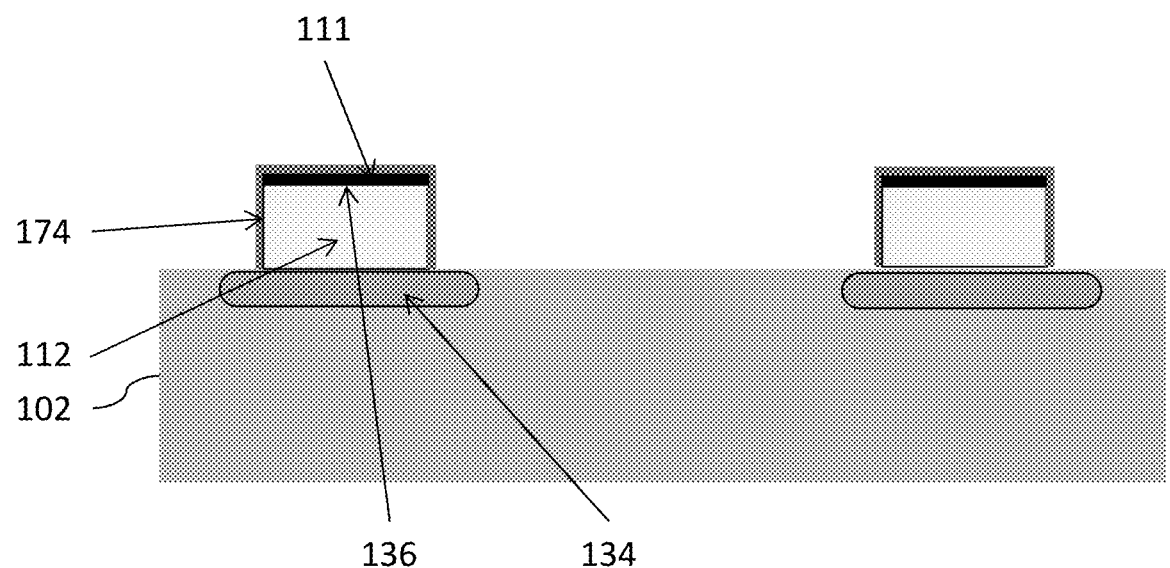
Figure 19:
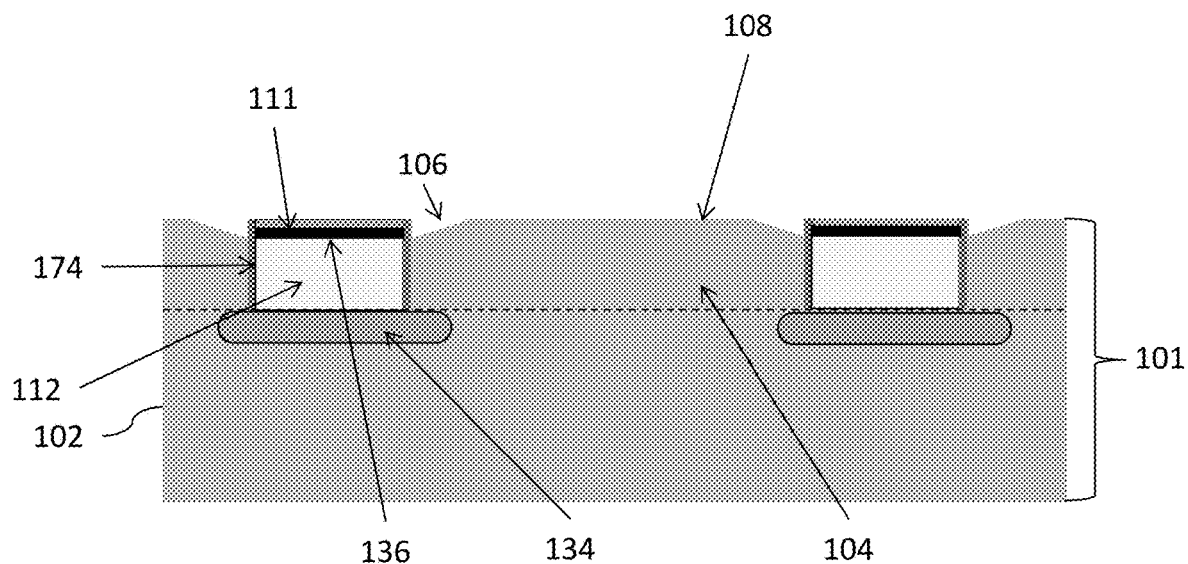
Figure 20:
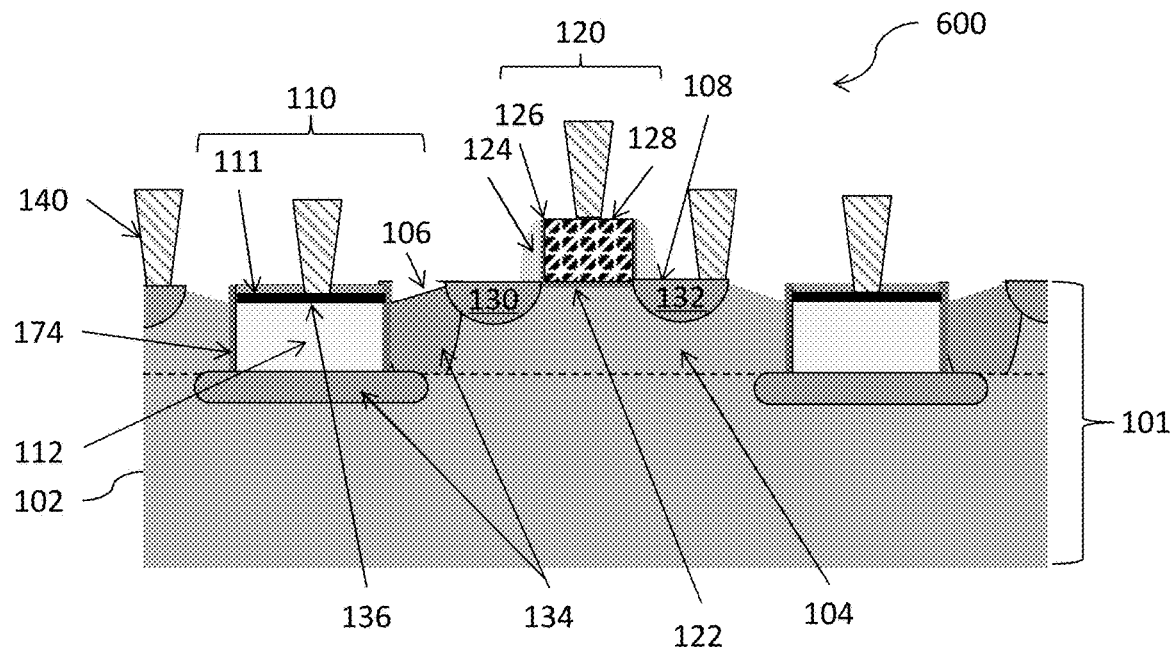
FIG. 20 is a cross-sectional conceptual diagram illustrating a photodiode structure according to embodiments herein.

FIGS. 15-19 illustrate alternative processing resulting in alternative structures shown in FIG. 20. Specifically, FIG. 15 illustrates processing that provides the substrate base 102 (discussed above), forms the impurity regions 134 (discussed above), and forms the photo-absorptive material 109 (discussed above). FIG. 15 shows alternative processing where an insulator layer 171 (e.g., an oxide) is formed (e.g., grown in a heated oxide-rich environment) on the photo-absorptive material 109.

Figure 16:
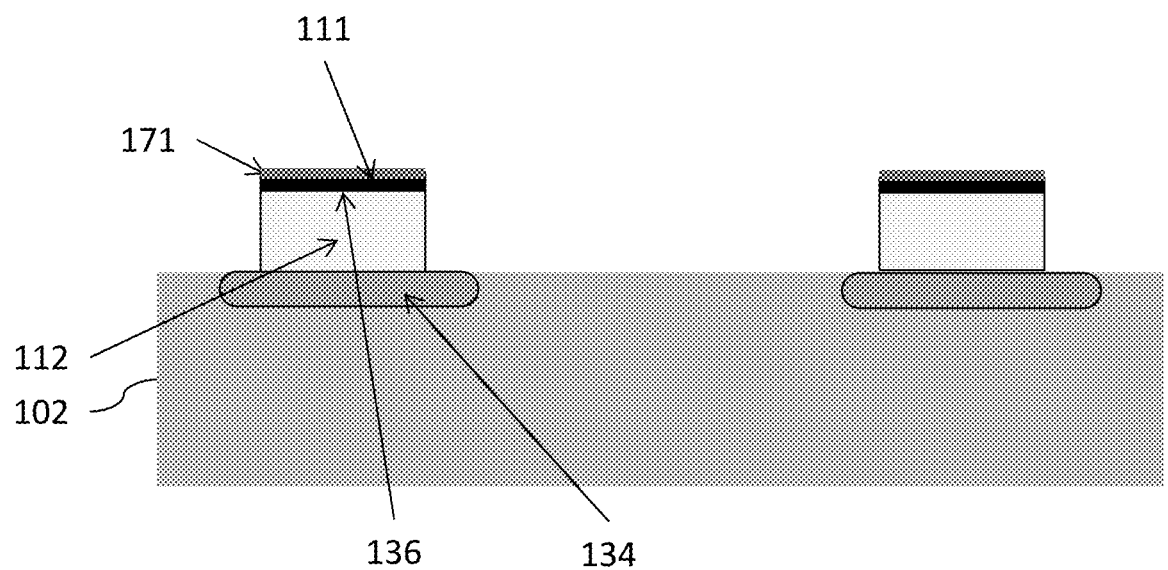
Figure 17:
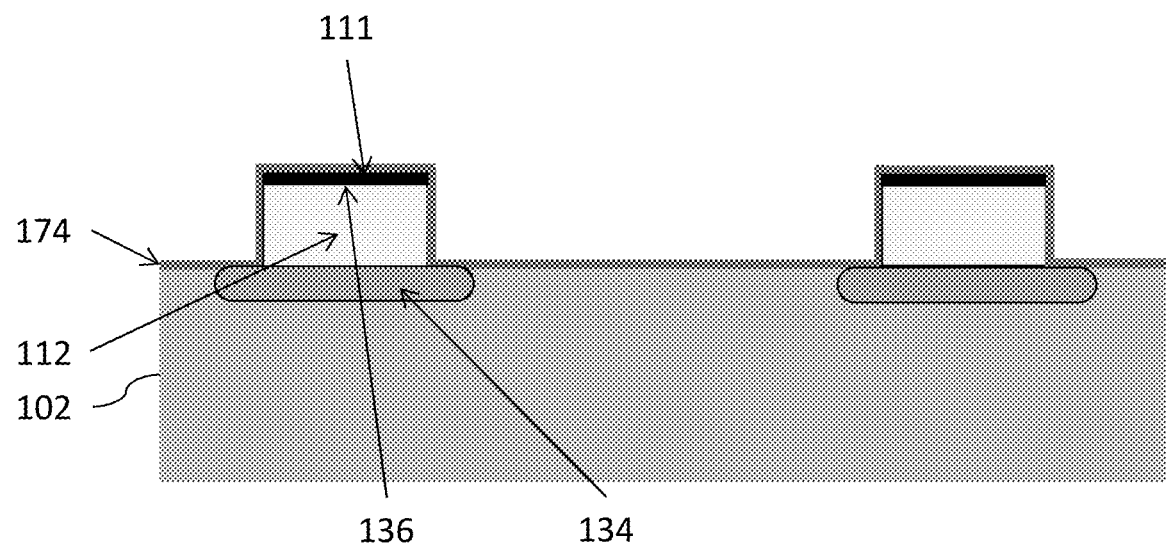

As shown in FIG. 16, using patterning processes similar to those described above, the photo-absorptive material 109 and insulator layer 171 are patterned. This again forms the photodiodes 112, as described above. FIG. 17 illustrates processing that forms an additional insulator 174 (again in a growth process) that may consume the insulator layer 171. FIG. 18 illustrates a patterning process that removes the additional insulator 174 from between the photodiodes 112.

FIG. 19 uses the processing described above to epitaxially grow the substrate extensions 104 between the photodiodes 112. As noted above, the processing in FIG. 19 forms the facets 106 and the top 108 of the substrate extension 104 can be grown to different distances from the top of the substrate base 102 relative to the top 111 of the photodiode 112.

FIG. 20 illustrates the same processing that is used to form the additional impurity regions 134 and the various components of the additional device 120 (e.g., source/drain 130, 132; sidewall spacers 124, 126; gate oxide 122; gate conductor 128; contacts 140; etc.). This results in structure 600 shown in FIG. 20 which is similar to the previous structures but uses a thinner sidewall spacer (single layer sidewall spacer 174) which can allow the structure to be more compact when compared to the other structures described herein.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed (grown or deposited) from any of the many candidate low dielectric constant materials (low-K (where K corresponds to the dielectric constant of silicon dioxide) materials such as fluorine or carbon-doped silicon dioxide, porous silicon dioxide, porous carbon-doped silicon dioxide, spin-on silicon or organic polymeric dielectrics, etc.) or high dielectric constant (high-K) materials, including but not limited to silicon nitride, silicon oxynitride, a gate dielectric stack of $SiO_2$ and $Si_3N_4$, hafnium oxide ($HfO_2$), hafnium zirconium oxide ($HfZrO_2$), zirconium dioxide ($ZrO_2$), hafnium silicon oxynitride (HfSiON), hafnium aluminum oxide compounds ($HfAlO_x$), other metal oxides like tantalum oxide, etc. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A structure comprising:
   a substrate comprising a substrate base having a top surface and a substrate extension comprising a semiconductor layer above and immediately adjacent to the top surface of the substrate base;
   a photodiode contacting the substrate base, wherein the substrate extension is positioned laterally adjacent the photodiode;
   an additional device contacting the substrate extension; and
   a sidewall spacer between the photodiode and the substrate extension,
   wherein the additional device includes conductive elements within the substrate extension adjacent the sidewall spacer, wherein the substrate extension has a substrate extension top surface, wherein the substrate extension has a facet surface adjacent the sidewall spacer and the substrate extension top surface, and wherein the facet surface is non-parallel to the substrate extension top surface.

2. The structure according to claim 1, wherein the photodiode has a photodiode top surface, wherein the substrate extension has a substrate extension top surface that lies in a different plane from the photodiode top surface, and wherein the additional device contacts the substrate extension top surface.

3. The structure according to claim 1, wherein the sidewall spacer comprises:
   a first insulator layer contacting the photodiode and the substrate base; and
   a second insulator layer contacting the first insulator layer and the substrate extension.

4. The structure according to claim 3, further comprising a cap contacting the photodiode, wherein the cap and the second insulator layer comprise the same material.

5. The structure according to claim 1, wherein the substrate extension has a substrate extension top surface, wherein the additional device comprises a field effect transistor comprising: a gate oxide contacting the substrate extension top surface; and a gate conductor contacting the gate oxide, and wherein the conductive elements comprise source and drain regions of the field effect transistor.

6. The structure according to claim 1, further comprising an impurity region within the substrate extension electrically connecting the photodiode to the additional device.

7. A method comprising:
   providing a substrate; and
   forming a structure comprising: the substrate including a substrate base having a top surface and a substrate extension comprising a semiconductor layer immediately adjacent to the top surface of the substrate base; a photodiode contacting the substrate base, wherein the substrate extension positioned laterally adjacent the photodiode; an additional device contacting the substrate extension; and a sidewall spacer between the photodiode and the substrate extension, wherein the substrate extension is formed to have a substrate extension top surface, wherein the additional device includes conductive elements within the substrate extension adjacent the side wall spacer, wherein the substrate extension is formed to have a facet surface adjacent the sidewall spacer and the substrate extension top surface, and wherein the facet surface is formed to be non-parallel to the substrate extension top surface.

8. The method according to claim 7, wherein the photodiode is formed to have a photodiode top surface, wherein the substrate extension is formed to have a substrate extension top surface that lies in a different plane from the photodiode top surface, and wherein the additional device is formed to contact the substrate extension top surface.

9. The method according to claim 7, wherein the sidewall spacer is formed to comprise:
   a first insulator layer contacting the photodiode and the substrate base; and a second insulator layer contacting the first insulator layer and the substrate extension.

10. The method according to claim 9, further comprising forming a cap on the photodiode, wherein the cap and the second insulator layer are formed of the same material.

11. The method according to claim 7, wherein the substrate extension is formed to have a substrate extension top surface, wherein the additional device is formed as a field effect transistor comprising: a gate oxide contacting the substrate extension top surface; a gate conductor contacting the gate oxide; and source and drain regions.

12. A structure comprising:
a substrate comprising a substrate base and a substrate extension;
a photodiode contacting the substrate base, wherein the substrate extension is adjacent the photodiode;
an additional device contacting the substrate extension; and
a sidewall spacer between the photodiode and the substrate extension,
wherein the additional device includes conductive elements within the substrate extension adjacent the sidewall spacer, and
wherein the sidewall spacer comprises:
a first insulator layer contacting the photodiode and the substrate base; and
a second insulator layer contacting the first insulator layer and the substrate extension.

13. The structure according to claim 12, wherein the photodiode has a photodiode top surface, wherein the substrate extension has a substrate extension top surface that lies in a different plane from the photodiode top surface, and wherein the additional device contacts the substrate extension top surface.

14. The structure according to claim 12, wherein the substrate extension has a substrate extension top surface, wherein the substrate extension has a facet surface adjacent the sidewall spacer and the substrate extension top surface, and wherein the facet surface is non-parallel to the substrate extension top surface.

15. The structure according to claim 12, further comprising a cap contacting the photodiode, wherein the cap and the second insulator layer comprise the same material.

16. The structure according to claim 12, wherein the substrate extension has a substrate extension top surface, wherein the additional device comprises a field effect transistor comprising: a gate oxide contacting the substrate extension top surface; and a gate conductor contacting the gate oxide, and wherein the conductive elements comprise source and drain regions of the field effect transistor.

17. The structure according to claim 12, further comprising an impurity region within the substrate extension electrically connecting the photodiode to the additional device.

* * * * *